United States Patent
Kim et al.

(10) Patent No.: US 10,854,484 B1
(45) Date of Patent: Dec. 1, 2020

(54) METHOD AND SYSTEM FOR MANAGING LIQUID SUPPLY

(71) Applicant: XIA TAI XIN SEMICONDUCTOR (QING DAO) LTD., Qingdao (CN)

(72) Inventors: Jae-Sik Kim, Singapore (SG); Jong-Kill Lim, Singapore (SG); Sungkun Jang, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/788,065

(22) Filed: Feb. 11, 2020

(30) Foreign Application Priority Data

Nov. 8, 2019 (CN) .......................... 2019 1 1089321

(51) Int. Cl.
 *H01L 21/67* (2006.01)
 *G03F 7/00* (2006.01)
(52) U.S. Cl.
 CPC .......... *H01L 21/6715* (2013.01); *G03F 7/003* (2013.01); *F17C 2205/0138* (2013.01); *F17C 2227/04* (2013.01); *F17C 2227/045* (2013.01)
(58) Field of Classification Search
 CPC .......... H01L 21/6715; F17C 2227/043; F17C 2227/045; F17C 2250/01; F17C 2205/0134; F17C 2205/0138; F17C 2227/04
 USPC ................................ 137/255, 259, 265, 266
 See application file for complete search history.

(56) References Cited

U.S. PATENT DOCUMENTS

| 4,601,409 | A | * | 7/1986 | DiRegolo | B67D 7/0283 137/205 |
|---|---|---|---|---|---|
| 5,383,574 | A | * | 1/1995 | Raphael | B67D 1/1245 137/205 |
| 6,098,843 | A | * | 8/2000 | Soberanis | B67D 7/0238 222/53 |
| 6,881,267 | B2 | * | 4/2005 | Kim | B05C 11/101 118/683 |
| 7,189,434 | B2 | * | 3/2007 | Kim | G03F 7/162 222/55 |
| 7,685,963 | B2 | * | 3/2010 | Lee | G03F 7/016 118/319 |
| 2003/0010792 | A1 | * | 1/2003 | Forshey | B67D 7/0272 222/56 |
| 2005/0224132 | A1 | * | 10/2005 | Jang | H01L 21/6715 141/1 |
| 2006/0141130 | A1 | * | 6/2006 | Kwon | C03C 17/002 427/58 |
| 2007/0119307 | A1 | * | 5/2007 | Park | B01D 19/0036 96/243 |
| 2014/0174475 | A1 | * | 6/2014 | Takayanagi | F04B 49/065 134/18 |

(Continued)

*Primary Examiner* — Steven Whitesell Gordon
(74) *Attorney, Agent, or Firm* — ScienBiziP, P.C.

(57) ABSTRACT

A system for managing liquid supply is provided. The system includes an air pressure adjustor, a first liquid container, a second liquid container, a first tube, a second tube, an inlet sensor, and an outlet sensor. The first liquid container includes a liquid. The second liquid container includes an inlet and an outlet. The first tube is configured to be connected between the first liquid container and the inlet. The second tube is configured to be connected between the outlet and the air pressure adjustor. The inlet sensor is disposed on the first tube and for detecting the liquid flowing into the inlet. The outlet sensor is disposed on the second tube and for detecting the liquid flowing out from the outlet.

13 Claims, 4 Drawing Sheets

(56) References Cited

U.S. PATENT DOCUMENTS

| | | | |
|---|---|---|---|
| 2015/0092167 A1* | 4/2015 | Terashita | H01L 21/67017 355/30 |
| 2015/0140485 A1* | 5/2015 | Sasa | H01L 21/67017 430/30 |
| 2020/0070195 A1* | 3/2020 | Huang | B01D 19/0031 |

* cited by examiner

US 10,854,484 B1

METHOD AND SYSTEM FOR MANAGING LIQUID SUPPLY

CROSS REFERENCE TO RELATED APPLICATION(S)

The present application claims priority and the benefit of Chinese Application No. 201911097116.0, filed on Nov. 11, 2019, the contents of which are incorporated herein by reference.

FIELD

The present disclosure relates to a method for managing photoresist supply and more specifically to a method for reloading photoresist from a source container to a buffer container.

BACKGROUND

Prior to dispensing a photoresist on a wafer for lithographic process through a pump device, the photoresist is stored in a buffer tank connected to the pump device. The photoresist in the buffer tank is supplied from a replaceable bottle. By pressurizing the replaceable bottle with nitrogen ($N_2$), the photoresist in the replaceable bottle would flow into the buffer tank.

However, the pressurizing process tends to generate micro bubbles in the photoresist, which cause defects on chips in the wafer and result in significant yield drop. Furthermore, a purge process for removing the micro bubbles on the wafer wastes an additional 1000 cc (cubic centimeter) of photoresist and increase down time on the manufacturing line.

SUMMARY

The following presents a summary of examples of the present disclosure in order to provide a basic understanding of at least some of its examples. This summary is not an extensive overview of the present disclosure. It is not intended to identify key or critical elements of the present disclosure or to delineate the scope of the present disclosure. The following summary merely presents some concepts of the present disclosure in a general form as a prelude to the more detailed description provided below.

In one example, a system is provided for managing liquid supply including an air pressure adjustor, a first liquid container, a second liquid container, a first tube, a second tube, an inlet sensor, and an outlet sensor. The first liquid container includes a liquid. The second liquid container includes an inlet and an outlet. The first tube is configured to be connected between the first liquid container and the inlet. The second tube is configured to be connected between the outlet and the air pressure adjustor. The inlet sensor is disposed on the first tube and for detecting the liquid flowing into the inlet. The outlet sensor is disposed on the second tube and for detecting the liquid flowing out from the outlet.

In another example, a method is provided for managing liquid supply from a first liquid container to a second liquid container. The method includes the actions of: providing a first tube connected between the first liquid container and second liquid container; providing a second tube connected between the second liquid container and an air pressure adjustor; in response to data received from an inlet sensor detecting the liquid flowing into the second liquid container, closing a drain valve and opening an outlet valve; and switching on the air pressure adjustor for creating a vacuum in the second liquid container, the first tube, and the second tube.

The details of one or more examples are set forth in the accompanying drawings and description below.

BRIEF DESCRIPTION OF THE DRAWINGS

The accompanying drawings illustrate one or more implementations of the present disclosure and, together with the written description, explain the principles of the present disclosure. Wherever possible, the same reference numbers are used throughout the drawings referring to the same or like elements of an implementation.

DETAILED DESCRIPTION

Figure 1A:
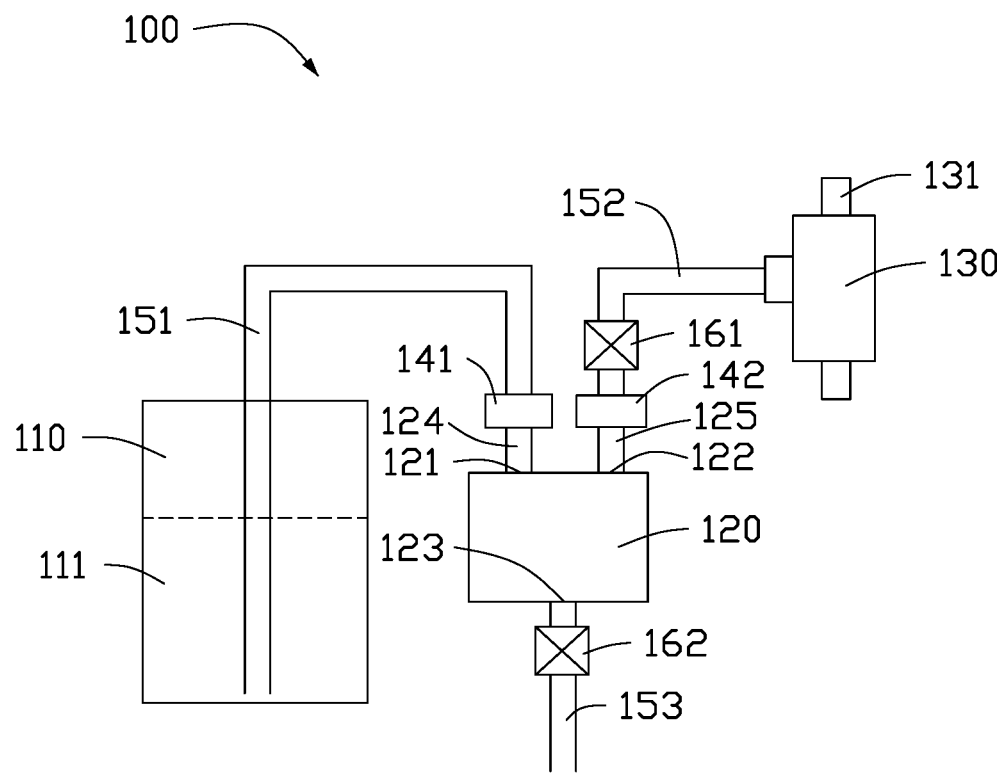
FIG. 1A is a schematic illustration of a system for managing liquid supply in accordance with an implementation of the present disclosure.

To facilitate an understanding of the principles and features of the various implementations of the present disclosure, various illustrative implementations are explained below. Although example implementations of the present disclosure are explained in detail, it is to be understood that other implementations are contemplated. Accordingly, it is not intended that the present disclosure is limited in its scope to the details of construction and arrangement of components set forth in the following description or illustrated in the drawings. The present disclosure is capable of other implementations and of being practiced or carried out in various ways.

FIG. 1A illustrates a configuration of a system 100 for managing liquid supply in accordance with an implementation of the present disclosure. The system 100 includes a first liquid container 110, a second liquid container 120, an air pressure adjustor 130, a first tube 151 connecting the first liquid container 110 and the second liquid container 120, a second tube 152 connecting the second liquid container 120 and the air pressure adjustor 130, and a drain tube 153 connecting the second liquid container 120 and an external pump (not shown). In some implementations, the first liquid container 110 supplies a liquid 111, such as photoresist. The first liquid container 110 may be replaced when empty. The second liquid container 120 is a buffering storage for storing the photoresist supplied from the first liquid container 110. The air pressure adjustor 130 is an ejector for adjusting air pressure in the system. For example, the air pressure adjustor may create a vacuum in the first tube 151, the second liquid container 120, and the second tube 152. Steam may be used as a motive fluid to withdraw air. The steam leaves a nozzle 131 of the ejector at a high velocity so as to create the vacuum.

In some implementations, the second liquid container 120 includes an inlet 121, an outlet 122, and a drain 123. The first tube 151 is connected to the inlet 121. The second tube 152 is connected to the outlet 122. The drain tube 153 is connected to the drain 123.

The system 100 further includes an outlet sensor 142, an inlet sensor 141, an outlet valve 161, and a drain valve 162. The outlet sensor 142 is mounted at a predetermined position between the outlet 122 and the outlet valve 161 for detecting liquid flowing out from the outlet 122. The inlet sensor 141 is mounted at a predetermined position between the first liquid container 110 and the inlet 121 for detecting liquid flowing into the inlet 121.

For example, a portion 124 of the first tube 151 adjacent to the inlet 121 is monitored by the inlet sensor 141, and a portion 125 of the second tube 152 adjacent to the outlet 122 is monitored by the outlet sensor 142. For example, the inlet sensor 141 may transmit data including a signal indicating an absence of photoresist in the portion 124 to indicate that the first liquid container is empty. The outlet sensor 142 may transmit data including a signal indicating a presence of photoresist in the portion 125 to indicate that the second liquid container is full.

Figure 1B:
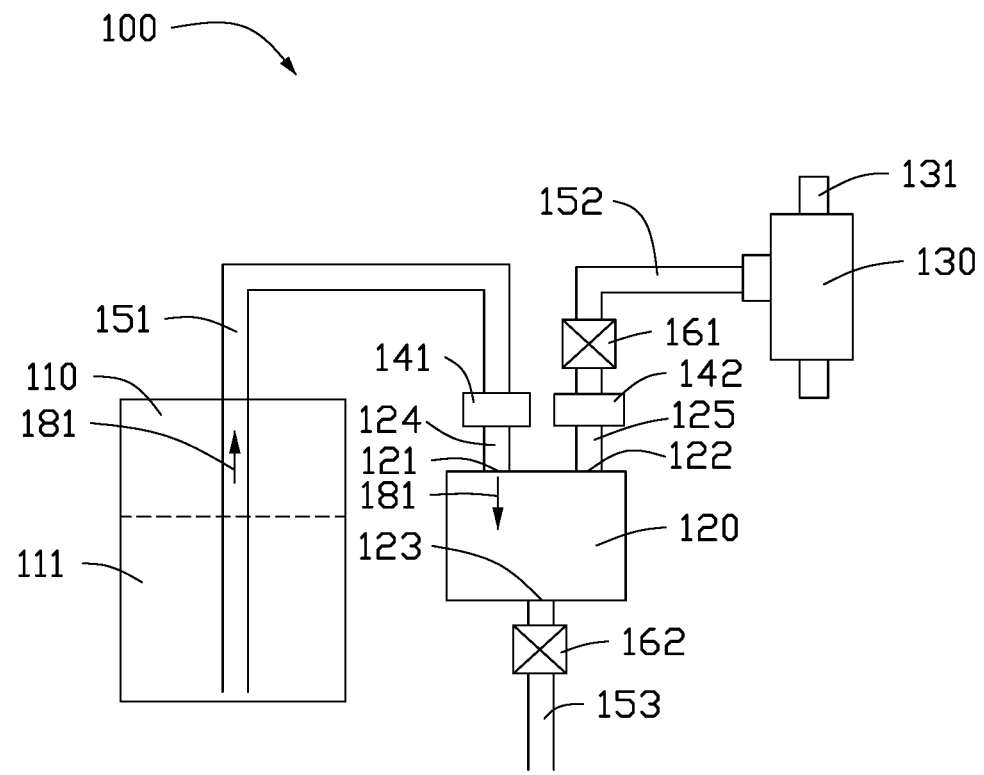
FIG. 1B is a schematic illustration of a reloading mode operated by the system of FIG. 1A.

FIG. 1B illustrates a reloading mode operated by the system 100 shown in FIG. 1A. The system 100 further includes a control unit (not shown) coupled to the air pressure adjustor 130, the inlet sensor 141 the outlet sensor 142, the outlet valve 161, and the drain valve 162. When the inlet sensor 141 detects that the first liquid container is empty, the control unit may transmit a signal to close the drain valve 162 and open the outlet valve 161. Subsequently or optionally, the control unit may send an alert to a monitoring panel (not shown) to prompt a replacement of the first liquid container. The reloading mode may be initiated by a confirmation associated with the replacement of the first liquid container 110. In the reloading mode, the air pressure adjustor 130 is switched on by the control unit. By creating a vacuum in the first tube 151, the second liquid container 120, and the second tube 152, the liquid 111 (e.g., a photoresist) is sucked from the first liquid container 110 into the second liquid container 120 as indicated by arrows 181. When the outlet sensor 142 detects that the second liquid container 120 is full, the control unit may transmit a signal to close the outlet valve 161 and switch off the air pressure adjustor 130 to end the reloading mode.

Figure 1C:
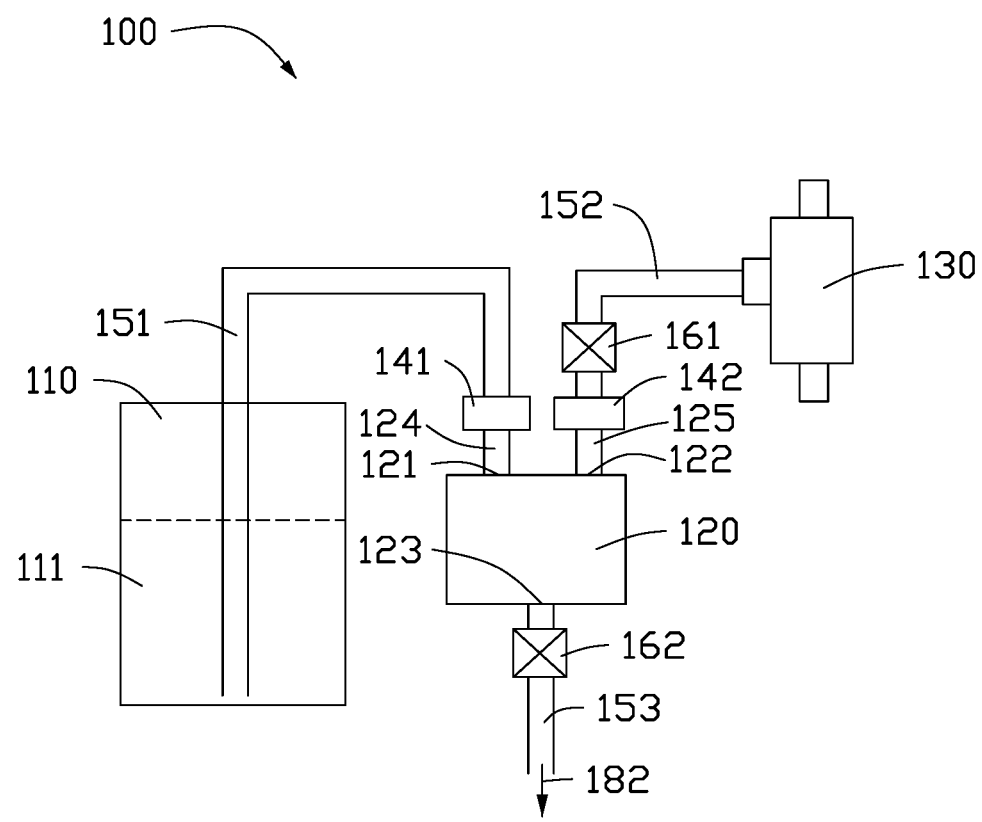
FIG. 1C is a schematic illustration of a releasing mode operated by the system of FIG. 1A.

FIG. 1C illustrates a releasing mode operated by the system 100 shown in FIG. 1A. The releasing mode may be initiated subsequent to the reloading mode. In the releasing mode, the control unit may transmit a signal to open the drain valve 162 for supplying the photoresist to the external pump as indicated by an arrow 182.

Figure 2:
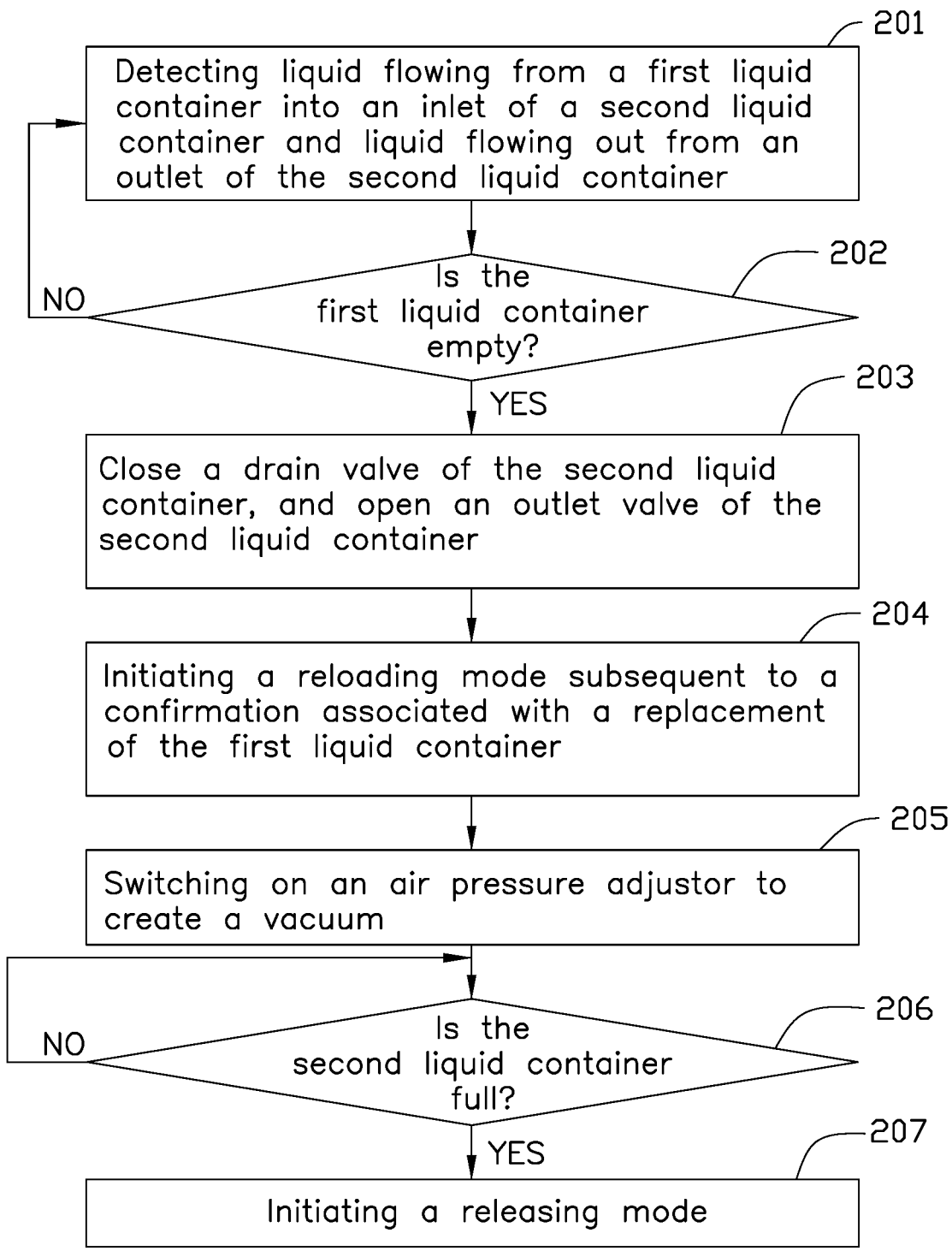
FIG. 2 is a flowchart depicting example operations of the system of FIG. 1A.

FIG. 2 illustrates a flowchart depicting example operations of the system 100 shown in FIG. 1A. For purposes of illustration, FIG. 2 is described below within the context of FIGS. 1A-1C.

As shown in action 201, the inlet sensor 141 is configured to detect liquid from the first liquid container 110 flowing into the inlet 121 of the second liquid container 120, and the outlet sensor 142 is configured to detect liquid flowing out from the outlet 122 of the second liquid container 120. For example, the control unit may perform an operation based on data received from the inlet sensor 141 and the outlet sensor 142.

As shown in action 202, the system 100 determines whether the first liquid container 110 is empty. If an absence of photoresist in the portion 124 is detected by the inlet sensor 141, the method may proceed to action 203. Otherwise, the method returns to action 201.

As shown in action 203, the system 100 may transmit a signal to close the drain valve 162 and open the outlet valve 161. For example, the operation includes closing the drain valve and opening the outlet valve when the inlet sensor detects that the first liquid container is empty.

As shown in action 204, subsequent to receipt of a confirmation associated with the replacement of the first liquid container 110, the system 100 may initiate a reloading mode.

As shown in action 205, the system 100 may transmit a signal to switch on the air pressure adjustor 130 to create a vacuum. Accordingly, the photoresist in the first liquid container 110 would be sucked into the second liquid container 120. For example, the operation includes switching on the air pressure adjustor 130 to create a vacuum in the first tube 151, the second liquid container 120, and the second tube 152.

As shown in action 206, the system 100 determines whether the second liquid container 120 is full. If a presence of photoresist in the portion 125 is detected by the outlet sensor 142, the system 100 may proceed to action 207. For example, the operation includes closing the outlet valve 161 and switching off the air pressure adjustor 130 when the outlet sensor 142 detects that the second liquid container 120 is full. Otherwise, the air pressure adjustor 130 continues to operate.

As shown in action 207, the system 100 may transmit a signal to open the drain valve 162 for initiating a releasing mode to supply the photoresist to the external pump.

The terminology used herein is for the purpose of describing particular implementations only and is not intended to be limiting of implementations of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, actions, operations, elements, and/or components, but do not preclude the presence or addition of one or more other features, integers, actions, operations, elements, components, and/or groups thereof.

The corresponding structures, materials, acts, and equivalents of all means or action plus function elements in the claims below are intended to include any structure, material, or act for performing the function in combination with other claimed elements as specifically claimed. The description of the present disclosure has been presented for purposes of illustration and description, but is not intended to be exhaustive or limited to implementations of the present disclosure in the form disclosed. Many modifications and variations will be apparent to those of ordinary skill in the art without departing from the scope and spirit of implementations of the present disclosure. The implementation was chosen and described in order to best explain the principles of implementations of the present disclosure and the practical application, and to enable others of ordinary skill in the art to understand implementations of the present disclosure for various implementations with various modifications as are suited to the particular use contemplated.

Although specific implementations have been illustrated and described herein, those of ordinary skill in the art appreciate that any arrangement which is calculated to achieve the same purpose may be substituted for the specific implementations shown and that implementations of the present disclosure have other applications in other environments. This present disclosure is intended to cover any adaptations or variations of the present disclosure. The following claims are in no way intended to limit the scope of implementations of the present disclosure to the specific implementations described herein.

Various examples have been described. These and other examples are within the scope of the following claims.

What is claimed is:

1. A system for managing liquid supply, the system comprising:
   an air pressure adjustor;
   a first liquid container comprising a liquid;
   a second liquid container comprising a drain, an inlet and an outlet;
   a first tube connected between the first liquid container and the inlet;
   a second tube connected between the outlet and the air pressure adjustor;
   an inlet sensor disposed on the first tube and for detecting the liquid flowing into the inlet;
   an outlet sensor disposed on the second tube and for detecting the liquid flowing out from the outlet;
   an outlet valve disposed between the outlet sensor and the air pressure adjustor;
   a drain tube connected to the drain;
   a drain valve disposed on the drain tube; and
   a control unit coupled to the inlet sensor, the outlet sensor, the outlet valve, the drain valve, and the air pressure adjustor, the control unit configured to:
      retrieve data from the inlet sensor and the outlet sensor; and
      perform an operation comprising closing the drain valve and opening the outlet valve when the inlet sensor detects that the first liquid container is empty.

2. The system of claim 1, wherein the air pressure adjustor is an air ejector.

3. The system of claim 1, wherein the drain tube is connected to an external pump.

4. The system of claim 1, wherein the operation further comprises:
   switching on the air pressure adjustor to create a vacuum in the first tube, the second liquid container, and the second tube through the outlet valve, after a replacement of the first liquid container.

5. The system of claim 1, wherein the operation further comprises:
   closing the outlet valve and switching off the air pressure adjustor when the outlet sensor detects that the second liquid container is full.

6. The system of claim 1, wherein the liquid comprises a photoresist.

7. A method for managing liquid supply from a first liquid container to a second liquid container, the method comprising:
   providing a system for managing liquid supply, the system comprising:
      a first liquid container comprising a liquid;
      a second liquid container comprising a drain, an inlet and an outlet;
      a first tube connected between the first liquid container and the inlet;
      a second tube connected between the outlet and the air pressure adjustor;
      an inlet sensor disposed on the first tube and for detecting the liquid flowing into the inlet;
      an outlet sensor disposed on the second tube and for detecting the liquid flowing out from the outlet;
      an outlet valve disposed between the outlet sensor and the air pressure adjustor;
      a drain tube connected to the drain;
      a drain valve disposed on the drain tube;
   in response to a first signal from the inlet sensor for indicating an absence of the liquid in a predetermined portion of the first tube, closing the drain valve and opening the outlet valve; and
   switching on the air pressure adjustor to create a vacuum in the second liquid container, the first tube, and the second tube.

8. The method of claim 7, further comprising:
   in response to data received from the outlet sensor, closing the outlet valve and switching off the air pressure adjustor.

9. The method of claim 8, wherein the data received from the outlet sensor comprises a second signal for indicating a presence of the liquid in a predetermined portion of the second tube.

10. The method of claim 7, wherein the air pressure adjustor is an air ejector.

11. The method of claim 7, wherein the liquid comprises a photoresist.

12. The method of claim 7, further comprising:
   sending an alert to an external device to prompt a replacement of the first liquid container.

13. The method of claim 12, further comprising:
   receiving a confirmation associated with the replacement of the first liquid container.

* * * * *